United States Patent
Lin et al.

(10) Patent No.: US 9,431,311 B1
(45) Date of Patent: Aug. 30, 2016

(54) SEMICONDUCTOR PACKAGE WITH ELASTIC COUPLER AND RELATED METHODS

(71) Applicant: SEMICONDUCTOR COMPONENTS INDUSTRIES, LLC, Phoenix, AZ (US)

(72) Inventors: Yusheng Lin, Phoenix, AZ (US); Chee Hiong Chew, Seremban (MY); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/626,758

(22) Filed: Feb. 19, 2015

(51) Int. Cl.
| | |
|---|---|
| *H01L 23/04* | (2006.01) |
| *H01L 23/053* | (2006.01) |
| *H01L 23/13* | (2006.01) |
| *H01L 23/498* | (2006.01) |
| *H01L 23/58* | (2006.01) |
| *H01L 21/52* | (2006.01) |
| *H01L 21/48* | (2006.01) |

(52) U.S. Cl.
CPC ......... *H01L 23/053* (2013.01); *H01L 21/4853* (2013.01); *H01L 21/52* (2013.01); *H01L 23/13* (2013.01); *H01L 23/49811* (2013.01); *H01L 23/49838* (2013.01); *H01L 23/58* (2013.01)

(58) Field of Classification Search
CPC ..................... H01L 21/67121; H01L 23/3114; H01L 23/49805; H01L 2023/405
See application file for complete search history.

(56) References Cited

U.S. PATENT DOCUMENTS

| | | | |
|---|---|---|---|
| 4,639,759 A | 1/1987 | Neidig et al. | |
| 4,670,771 A | 6/1987 | Neidig et al. | |
| 4,788,626 A | 11/1988 | Neidig et al. | |
| 5,306,169 A | 4/1994 | Fukushima et al. | |
| 5,371,043 A | 12/1994 | Anderson et al. | |

(Continued)

FOREIGN PATENT DOCUMENTS

| | | |
|---|---|---|
| DE | 4237632 | 5/1994 |
| DE | 19630173 | 1/1998 |
| EP | 1933379 | 6/2008 |

OTHER PUBLICATIONS

"Fuji IGBT Module Mounting instruction," published online at least as early as Dec. 4, 2014 by Fuji Electric Co., Ltd., available online at http://www.fujielectric.com/products/semiconductor/technical/mounting/box/doc/MT_IGBT/MT_IGBT_E_a.pdf, last visited Dec. 4, 2014.

(Continued)

*Primary Examiner* — Elias M Ullah
(74) *Attorney, Agent, or Firm* — Adam R. Stephenson, Ltd.

(57) ABSTRACT

A semiconductor package includes: a die coupled to a substrate; a housing coupled to the substrate and at least partially enclosing the die within a cavity of the housing, and; a pin fixedly coupled to the housing and electrically coupled with the die. The pin includes a reversibly elastically deformable lower portion, which in implementations includes a spring, configured to compress to prevent a lower end of the pin from lowering beyond a predetermined point relative to the substrate when the housing is lowered to be coupled to the substrate. The pin is fixedly coupled in a top of the housing and is configured to be coupled with the substrate by lowering the housing towards the substrate. In implementations the pin includes two rigid portions coupled together only with a coil spring, the spring biasing the rigid portions away from one another when the housing is lowered towards the substrate.

6 Claims, 4 Drawing Sheets

(56) References Cited

U.S. PATENT DOCUMENTS

| | | | |
|---|---|---|---|
| 5,465,481 A | 11/1995 | Romero | |
| 5,480,727 A | 1/1996 | Romero et al. | |
| 5,508,559 A | 4/1996 | Anderson et al. | |
| 5,533,257 A | 7/1996 | Romero et al. | |
| 5,544,412 A | 8/1996 | Romero et al. | |
| 5,565,705 A | 10/1996 | Romero et al. | |
| 5,616,886 A | 4/1997 | Romero et al. | |
| 5,666,269 A | 9/1997 | Romero et al. | |
| 5,786,230 A | 7/1998 | Anderson et al. | |
| 5,825,089 A | 10/1998 | Valenti et al. | |
| 5,898,128 A | 4/1999 | Romero et al. | |
| 5,915,463 A | 6/1999 | Romero et al. | |
| 6,154,369 A | 11/2000 | Martinez, Jr. et al. | |
| 6,155,856 A | 12/2000 | Sanada | |
| 6,511,336 B1 | 1/2003 | Turek et al. | |
| 6,787,900 B2 | 9/2004 | Shinohara et al. | |
| 6,930,385 B2 | 8/2005 | Hsu et al. | |
| 6,930,879 B2 | 8/2005 | Frisch et al. | |
| 6,958,534 B2 | 10/2005 | Stockmeier et al. | |
| 6,967,849 B1 | 11/2005 | Hwang et al. | |
| 6,997,727 B1 | 2/2006 | Legrady et al. | |
| 7,034,395 B2 | 4/2006 | Stolze | |
| 7,042,074 B2 | 5/2006 | Gobl et al. | |
| 7,187,074 B2 | 3/2007 | Uchiyama et al. | |
| 7,232,710 B2 | 6/2007 | Hsu et al. | |
| 7,264,481 B2 | 9/2007 | Herr et al. | |
| 7,589,418 B2 | 9/2009 | Lederer et al. | |
| 7,592,698 B2 | 9/2009 | Lederer et al. | |
| 7,626,256 B2 | 12/2009 | Gobl et al. | |
| 7,683,472 B2 | 3/2010 | Popp | |
| 7,701,054 B2 | 4/2010 | Stolze et al. | |
| 7,741,711 B2 | 6/2010 | Kroneder | |
| 7,867,016 B2 | 1/2011 | Nabilek et al. | |
| 7,919,854 B2 | 4/2011 | Stolze | |
| 7,982,290 B2 | 7/2011 | Chow et al. | |
| 8,087,943 B2 | 1/2012 | Stolze | |
| 8,130,499 B2 | 3/2012 | Ohnishi et al. | |
| 8,182,273 B2 | 5/2012 | Lederer | |
| 8,534,641 B2 | 9/2013 | Schalowski et al. | |
| 8,690,586 B2 | 4/2014 | Schneider | |
| 2004/0067698 A1 | 4/2004 | Lee | |
| 2009/0197439 A1 | 8/2009 | Nabilek et al. | |
| 2011/0260315 A1 | 10/2011 | Yamaguchi et al. | |
| 2011/0278706 A1 | 11/2011 | Herras | |
| 2013/0020694 A1 | 1/2013 | Liang et al. | |
| 2014/0001619 A1 | 1/2014 | Yoo et al. | |
| 2014/0003013 A1 | 1/2014 | Yoo et al. | |
| 2014/0199861 A1 | 7/2014 | Mattiuzzo | |
| 2014/0206122 A1* | 7/2014 | Fernandez | H01L 21/67121 438/48 |

OTHER PUBLICATIONS

"SPRiNG Technology," published online at least as early as Dec. 5, 2014 by Semikron International GmbH, available online at http://www.semikron.com/innovation-technology/construction-and-connection-technology/spring-technology.html, last visited Dec. 5, 2014.
"SKiiP Technology," published online at least as early as Dec. 5, 2014 by Semikron International, GmbH, available online at http://www.semikron.com/innovation-technology/construction-and-connection-technology/skiip-technology.html, last visited Dec. 5, 2014.
Eugene M. Chow, Christopher Chua, Thomas Hantschel, Koenrad Van Schuylenbergh, and David K. Fork, "Pressure Contact Micro-Springs in Small Pitch Flip-Chip Packages," IEEE Transactions on Components and Packaging Technologies, vol. 29, p. 796-803, published Dec. 2006.
Steven H. Voldman, "ESD Basics: From Semiconductor Manufacturing to Product Use," pp. 144, 190-193, published by John Wiley & Sons, Aug. 23, 2012.
Lunya Ma, Qi Zhu, S.K. Sitaraman, Chris Chua, D.K. Fork, Abstract of "Compliant cantilevered spring interconnects for flip-chip packaging," published online at least as early as Dec. 8, 2014, available online at http://ieeexplore.ieee.org/xpl/login.jsp?tp=&arnumber=927863&url=http%3A%2F%2Fieeexplore.ieee.org%2Fxpls%2Fabs_all.jsp%3Farnumber%3D927863, last visited Dec. 8, 2014.
Ralph E. Locher, "New Packages for Pressure Mounting," published online by IXYS Corporation at least as early as Dec. 8, 2014, available online at http://www.ixys.com/Documents/AppNotes/IXAN0029.pdf, last visited Dec. 8, 2014.
Dr. James A. Forster, "Tutorial: Burn-in Sockets for Chip-Scale Packages," published online by Chip Scale Review at least as early as Dec. 8, 2014, available online at http://www.chipscalereview.com/issues/ES/issues/0401/tutorial_01.html, last visited Dec. 8, 2014.
"Spring Pin Sockets," published online by Ironwood Electronics at least as early as Dec. 8, 2014, available online at http://www.ironwoodelectronics.com/products/sockets/spring_pin_sockets.cfm, last visited Dec. 8, 2014.
"Ball grid array," published online by Wikipedia at least as early as Dec. 8, 2014, available online at http://en.wikipedia.org/wiki/Ball_grid_array, last visited Dec. 8, 2014.
"Clamshell Spring Pin BGA Socket for ASE's 36 Balls FCCSP," published online by Ironwood Electronics at least as early as Dec. 8, 2014, available online at http://www.ironwoodelectronics.com/press/clamshell_socket_FCCSP.cfm, last visited Dec. 8, 2014.
Patrick Baginski, "The Design Concepts behind Vincotech Power Modules," published online at least as early as Oct. 11, 2013, available online at http://www.vincotech.com/fileadmin/user_upload/articles/Concept-of-Vincotech-Power-Modules/Concepts%20of%20Vincotech%20power%20modules_PB.pdf, last visited Jan. 20, 2015.
"Power Modules 2012/2013," catalog published online by Vincotech GmbH of Unterhaching, Germany at least as early as Dec. 31, 2012, available online at http://www.vincotech.com/fileadmin/downloads/power/Vincotech-Power_Modules-Catalog-2012-13.pdf, last visited Jan. 21, 2015.
"Power Modules 2013/14 Speed and Flexibility," catalog published online by Vincotech GmbH of Unterhaching, Germany at least as early as Dec. 31, 2013, available online at http://www.vincotech.com/fileadmin/downloads/power/Vincotech-Power_Modules-Catalog-2013-14.pdf, last visited Jan. 21, 2015.
Images of pin sold and used in the U.S., at least as early as Dec. 31, 2013, by Vincotech GmbH of Unterhaching, Germany.
Trench IGBT Module, SKiM 63 Electrostatic discharge sensitive device (ESDS) by SEMIKRON, Jul. 23, 2013.
SPRiNG Technology, Solder-free connection, by SEMIKRON, available online at http://www.semikron.com/innovation-technology/construction-and-connection-technology/spring-technology.html, last visited Jan. 30, 2015.

* cited by examiner

SEMICONDUCTOR PACKAGE WITH ELASTIC COUPLER AND RELATED METHODS

BACKGROUND

1. Technical Field

Aspects of this document relate generally to semiconductor device packages. Particular aspects of this document relate to power semiconductor device packages, such as power integrated modules (PIMs).

2. Background Art

Semiconductor devices are often encased within (or partly within) a package prior to use. Some packages contain a single die while others contain multiple die. The package offers protection to the die, such as from corrosion, impact and other damage, and often also includes electrical leads or other components which connect the electrical contacts of the die with a motherboard. The package may also include components configured to dissipate heat from the die into a motherboard, a heat sink, or otherwise away from the package. Some conventional semiconductor power packages have included springs exterior to the package for contact with external elements, and some of these may have included double-spring designs.

SUMMARY

Implementations of semiconductor packages may include: a die coupled to a substrate; a housing coupled to the substrate and at least partially enclosing the die within a cavity of the housing, and; a pin fixedly coupled to the housing and electrically coupled with the die, wherein the pin includes a reversibly elastically deformable lower portion configured to compress to prevent a lower end of the pin from lowering beyond a predetermined point relative to the substrate when the housing is lowered to be coupled to the substrate.

Implementations of semiconductor packages may include one, all, or any of the following:

A base of the pin may be coupled to the substrate with a spring.

The pin may be fixedly coupled in a top of the housing and may be configured to be coupled with the substrate by lowering the housing towards the substrate.

The pin may include two rigid portions coupled together only with a spring.

One of the rigid portions may include a flat plate.

The reversibly elastically deformable lower portion may include a spring.

The spring may include a coil spring.

Implementations of semiconductor packages may include: at least one die coupled to a substrate; a housing coupled to the substrate and at least partially enclosing the at least one die within a cavity of the housing, and; a plurality of pins fixedly coupled in a top of the housing, each of the plurality of pins electrically coupled with one of the at least one die through a connection trace of the substrate, each of the plurality of pins including a spring, wherein the spring of each pin biases an upper portion of the pin towards the housing.

Implementations of semiconductor packages may include one, all, or any of the following:

The spring of each pin may be positioned between two rigid portions of the pin.

The spring of each pin may bias the two rigid portions of the pin away from one another.

The spring of each pin may be compressed along a direction substantially parallel with a longest length of the pin.

The spring of each pin may be configured to prevent a contact surface of the pin from lowering beyond a predetermined point relative to the substrate when the housing is lowered towards the substrate.

The spring may include a helical spring.

Implementations of methods of forming a semiconductor package may include: securing a pin to a housing, the pin including a spring; lowering the housing relative to a substrate having a semiconductor die (die) coupled thereon to at least partially enclose the die within a cavity of the housing, and; while lowering the housing, compressing the spring so that a lower end of the pin does not lower beyond a predetermined point relative to the substrate and so that an upper portion of the pin is biased towards the housing, wherein lowering the housing includes electrically coupling the pin with the die.

Implementations of methods of forming a semiconductor package may include one, all, or any of the following:

The housing may be secured to the substrate.

Securing the housing to the substrate may include maintaining compression of the spring.

The lower end of the pin may be included in a flat plate of the pin and, prior to lowering the housing, the flat plate may be coupled to the upper portion of the pin through only the spring.

Compressing the spring may include compressing the spring between two rigid portions of the pin.

Compressing the spring may include biasing the two rigid portions of the pin away from one another.

Compressing the spring may include compressing the spring along a direction substantially parallel with a longest length of the pin.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages with elastic couplers and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages with elastic couplers and related methods, and implementing components and methods, consistent with the intended operation and methods.

"Top side" and "bottom side" are terms used in the industry to refer to sides of semiconductor die and sometimes relate to the nature of the electrical contacts on the side being referenced. A side having one or more electrical contacts not intending to be only used as a ground is sometimes called a "top side." A side having only electrical contacts which are intended to be used as an electrical ground is sometimes called a "bottom side." Nevertheless, for ease of explanation, as used herein the term "bottom side" in this document refers to the side of a die that is facing towards a bottom of a drawing page, while the term "top side" when used herein refers to the side of a die that is facing towards a top of a drawing page.

Figure 1:
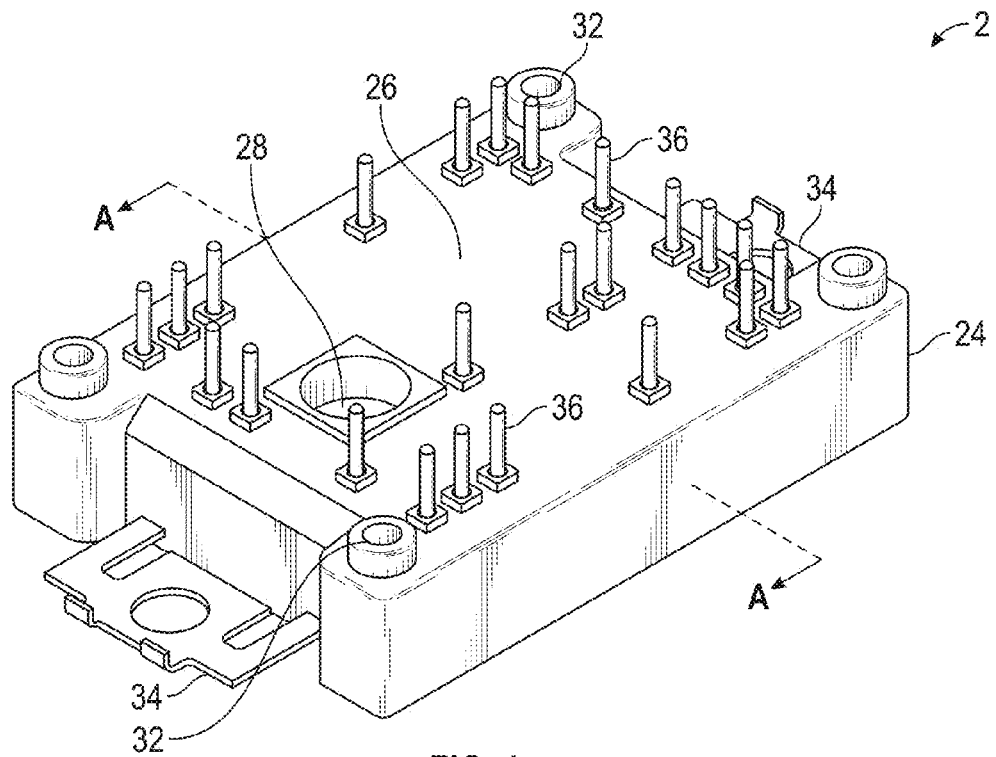
FIG. 1 is a perspective view of an implementation of a semiconductor package.
Figure 3:
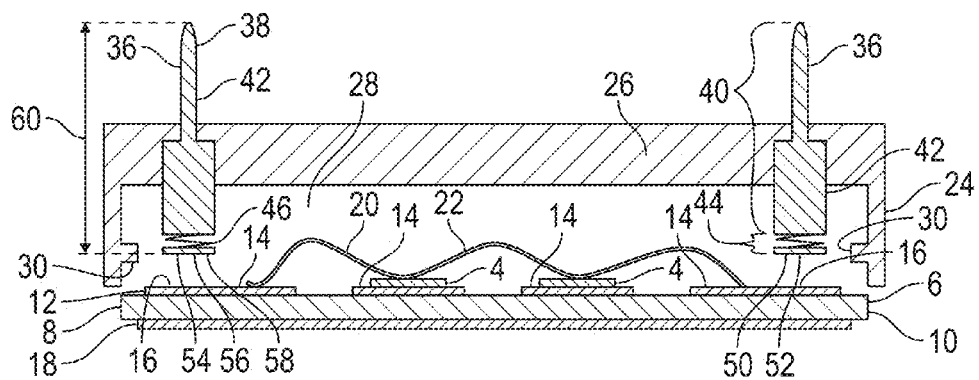
FIG. 3 is a cross-section view of the semiconductor package of FIG. 4 in an open configuration.
Figure 4:
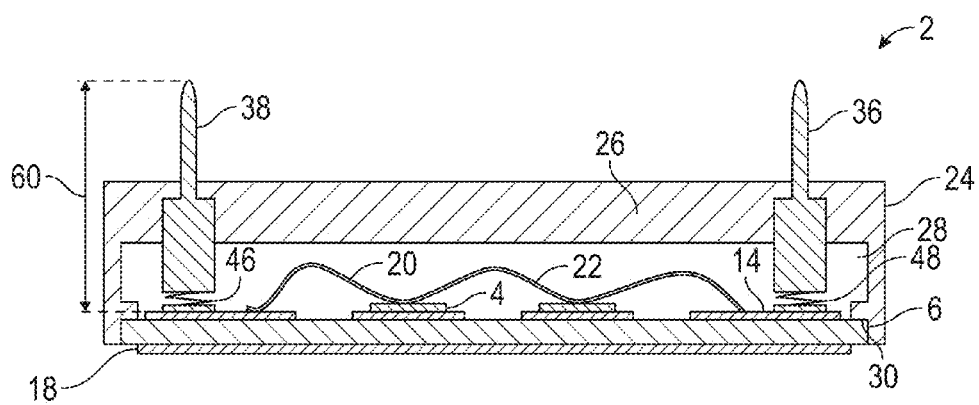
FIG. 4 is a cross-section view of the semiconductor package of FIG. 1 taken along line A-A.

Referring now to FIGS. 1, 3 and 4, as illustrated, a semiconductor package (package) 2 includes one or more die 4 coupled to a substrate 6. A housing 24 has one or more pins 38 fixedly coupled thereto and at least one of the pins is electrically coupled to one of the die 4. The package 2 in implementations is a power semiconductor device such as, by non-limiting example, a power integrated module (PIM), an integrated power module (IPM) or intelligent power module, and the like, and may include one or more power metal-oxide-semiconductor field-effect transistors (power MOSFETs), insulated gate bipolar transistors (IGBTs), and the like. The package 2 may be used, for example, for power applications in the auto industry, in industrial machines, in power generation, in household appliances, and so forth.

Although the package examples shown in the drawings are power semiconductor devices, in other applications similar pins and other packaging elements and methods disclosed herein may be used for packages which are not power semiconductor packages. In implementations in which the package 2 is a power semiconductor device the package 2 may include, by non-limiting example, one or more insulated gate bipolar transistor (IGBT) die electrically coupled, such as through a wirebond, clip or the like, with one or more diode rectifier die. By non-limiting example, referring to the package of FIG. 3, one of the die shown may be an IGBT while the other may be a diode rectifier.

Substrate 6 in implementations is a power electronic substrate and may include, by non-limiting example, a direct bonded copper (DBC) substrate, an active metal brazed (AMB) substrate, an insulated metal substrate (IMS), a ceramic substrate, and the like. Other types of substrates could be used. In implementations in which a DBC substrate is used the DBC substrate may have a copper layer only on one side of the DBC substrate (a side that includes connection traces) or, in other implementations, it may include a first copper layer on a first side of a ceramic layer and a second copper layer on a second side of the ceramic layer so that the ceramic layer is sandwiched between two copper layers. Substrate 6, for example, is a direct bonded copper (DBC) substrate 8 having a ceramic layer 10 sandwiched between a first copper layer 12 and second copper layer 18, and the first copper layer 12 includes connection traces 14. Other metallic and/or non-metallic layers may be included on the first and/or second copper layers 12, 18 in various implementations.

In some implementations one or more DBC substrates each having two copper layers, and each having connection traces in each copper layer, could be used. For example, although the implementation in FIG. 3 uses electrical couplers 20 that are wirebonds 22 to electrically couple electrical contacts of the die 4 with the connection traces 14, in other implementations the wirebonds 22 could be excluded and instead a second DBC substrate having connection traces on both sides (each in a copper layer) could be coupled to the die 4, the connection traces in a bottom side of the second DBC electrically coupling to the electrical contacts on a top side of the die 4 ("top side" meaning facing a top of the page in the drawings). A second layer of die 4 may then be placed atop the connection traces on the upper side of the second DBC substrate, and then further connections may be made with electrical contacts on a top side of the second layer of die 4, such as using electrical couplers 20, which may be wirebonds 22, conductive clips, or the like, and then further packaging may be done to achieve a structure similar to structures shown in the drawings but having a stacked configuration with multiple layers of die 4. Other stacking mechanisms and methods may be used, and those given here are just representative examples. In some implementations one or more or all of the die 4 could be coupled with the connection traces 14 using a flip-chip process using die bumps so that no wirebonds or conductive clips are needed.

The connection traces 14 route and electrically couple electrical contacts on the die 4 with other elements, such as the pins, other die 4, power sources, electrical grounds, other devices within or without the package 2, and the like. By non-limiting example, the connection traces to which the bottom side of each die 4 is coupled ("bottom side" referring to the sides of the die 4 facing a bottom of the page in the drawings) may connect conductive pads on the bottom sides of those die with electrical ground, while the electrical couplers 20 (such as wirebonds 22 or conductive clips) which are electrically coupled to pins 38 through other connection traces 14 may couple electrical contacts on the top sides of the die 4 with power sources. These are just representative examples, and one or more electrical contacts on the top sides of die may be coupled to electrical ground through the pins. Naturally, in cases in which flip chip packaging is used, one or more connection traces 14 may be used to couple one or more electrical contacts on the bottom side of the die 4 with electrical ground and one or more other connection traces 14 may be used to couple one or more other electrical contacts on the bottom side of the die 4 with one or more power sources through the pins, one or more other die 4, one or more other electrical devices within or without the package 2, and so forth.

Referring still to FIGS. 1, 3 and 4, the housing 24 in implementations is formed of a polymer, such as a thermoset, thermosoftening (thermopolymer), or other type of polymer or plastic—though in implementations it could also be formed of a composite material. Elastic couplers 36 are formed of an electrically conductive material, such as a metal, and are used to electrically and/or mechanically couple one or more electrical contacts of the die 4 with items outside the package 2, such as with a motherboard or printed circuit board (PCB), a power source, an electrical ground, other devices external to the package 2, and so forth. In cases in which a motherboard or PCB is used, the motherboard/PCB may include pin receivers, such as an array of cylindrical cavities, each pin receiver designed to receive one pin 38 and thereby electrically and mechanically couple thereto. The motherboard/PCB may further route the pins to other electric devices, power sources, electrical ground, other die 4, and so forth. In implementations one or more packages 2 may be coupled to a single motherboard/PCB and the multiple packages 2 may or may not be electrically interconnected through the motherboard/PCB.

The elastic couplers 36 are fixedly attached to the housing 24. This may be accomplished in a variety of ways. In the implementations illustrated in the drawings, the elastic couplers 36 have been integrated into a top 26 of the housing 24 by placing the elastic couplers 36 and housing 24 in the configuration shown while the housing 24 is in a liquid state and then allowing or causing the housing 24 to solidify. For example this may be done through a melting process, or a resin may be used which may be cured to form a solid phase, and so forth. In other implementations the same structure shown in FIGS. 3-4 may be accomplished by forming the housing 24 with portions configured to receive the pins 38 and then gluing, welding, or otherwise adhering the pins 38 to the portions of the housing 24 configured to receive them. In other implementations the housing 24 may have female threads and the pins 38 may have male threads and the two may be joined by coupling the threads together. Other coupling mechanisms may be used. In general the pins 38, at a point in the fabrication of the package 2 prior to coupling the pins with the connection traces 14, are fixedly coupled to the housing 24 and, therefore, generally not free to move relative to the housing 24 while the housing 24 is being lowered towards the substrate 6 to couple thereto.

The housing 24 includes a cavity 28 configured to receive the die 4 and other elements therein. The cavity at least partially encloses the die within the cavity. In the implementation shown in FIGS. 3-4 the housing includes a ledge 30 which rests atop the substrate 6, and which may be adhered thereto such as using an adhesive, though the ledge 30 may also just rest atop the substrate 6 without any adhesive and the substrate 6 may have one or more other coupling mechanisms such as screw holes so that the housing 24 may be coupled thereto by inserting screws into the openings 32 of housing 24 and screwing screws into screw holes of the substrate 6. Other coupling mechanisms such as clips, a friction fit, and the like are possible. In implementations an area proximate the ledge 30 and or including the ledge 30 (particularly the bottom face of the ledge 30), the vertical inner portion of the housing 24 below the ledge 30 and/or the portion of the substrate 6 that contacts these areas of the housing 24 may be roughened prior to coupling the housing and substrate together, such as with the use of an abrasive, in order to ensure a better bond when an adhesive is applied therebetween. In implementations in which a friction fit is used a similar roughening operation may be done in order to form a better or stronger fit therebetween, or in other words a fit having greater friction. In some implementations this roughening may be done with physical abrasion such as through sanding or blasting with a fluid having a grit element therein. In other implementations the roughening may be done through chemical means such as through an etching process or the like, though other mechanisms may also be used for roughening these surfaces. In other implementations, coupling structures may be included in the location of the housing 24 proximate the ledge 30 or including the ledge 30 to aid in establishing a friction fit, including, by non-limiting example projections, flanges, pin-like structures, bumps, and other structures that can couple against the edge of the substrate 6.

The elastic couplers 36 are pins 38 configured to electrically couple with the die 4 through the connection traces 14 and to electrically couple with a motherboard, PCB or other element external to package 2. Pin 38 has an upper portion 40, which includes a rigid portion 42, and a reversibly elastically deformable lower portion (lower portion) (elastic portion) 44. In some implementations all of the elastic portion 44 is reversibly elastically deformable, while in other implementations only a portion of the elastic portion 44 is reversibly elastically deformable. Referring to FIGS. 3-4, for instance, elastic portion 44 includes a spring 46 and a rigid portion 50. The rigid portion 50 forms a base 54 of the pin 38 and includes a flat plate 56 having a contact surface 58 on its underside configured to electrically couple with a connection trace 14. Thus, in the implementation of FIGS. 3-4 a lower end 52 of the pin 38 is a rigid portion 50, so that the elastic portion 44 includes both a spring 46 and a rigid portion 50. Thus, the elastic portion 44 in the implementations of FIGS. 3-4 has a portion which is reversibly elastically deformable and another portion which is not. Those portions that are not reversibly elastically deformable may be plastically deformable and/or non-reversibly elastically deformable.

In other implementations all of the elastic portion 44 could be reversibly elastically deformable. For example, in some cases the rigid portion 50 could be omitted entirely, so that the elastic portion 44 only includes spring 46. In such cases, the lower end 52 of the pin 38 would be the bottom of the spring 46, not the bottom of the flat plate 56, since the flat plate 56 would be excluded. In various implementations, the spring is a coil spring, such as a helical coil spring 48.

The elastic section 44 in implementations is formed entirely in: the bottom half; the bottom third; the bottom fourth; the bottom fifth; the bottom sixth; the bottom seventh; the bottom eighth; the bottom ninth; the bottom tenth; the bottom eleventh; the bottom twelfth; the bottom thirteenth; the bottom fourteenth; the bottom fifteenth; the bottom sixteenth; and so forth, of the pin 38. In implementations the pin 38 may have a longest length 60 of, or of about, 14 mm, and the spring 46 may have a length, measured along the same direction of the longest length 60, of, or of about, 1 mm. The spring 46 may be configured to compress from a length of, or of about, 1 mm to a length of, or of about: 0.9 mm; 0.8 mm; 0.7 mm, 0.6 mm, 0.5 mm, 0.4 mm, 0.3 mm; and so forth. Accordingly, spring material and spring constants for the spring 46 may be selected according to the desired compression characteristics. In implementations of springs herein the spring may have a length, parallel with a longest length of the pin, of greater than 1 mm.

In implementations the spring 46 is formed of, by non-limiting example: a high carbon spring steel; a stainless steel, a steel alloy having one or more of chromium, vanadium, nickel, molybdenum, and/or aluminum; a bronze alloy; an alloy of beryllium and copper; an alloy of nickel and copper; an alloy of iron, chromium and nickel; and the like. Although the springs 46 shown in the drawings have a straight cylindrical profile (i.e., the coils are of the same diameter), in other implementations the springs may have a conical profile with decreasing coil diameters (going in either direction) such that the individual coils are not forced against one another, or not as much, in compression, thus allowing greater overall compression of the spring 46. Other configurations are possible using the principles disclosed in this document. The spring 46 may be coupled to the rigid portions using, by non-limiting example: a solder; a conductive adhesive; a weld; and the like. In various implementations, the entirety of each pin, including the rigid portion(s) and the spring, could be integrally formed from a single piece of material so that the spring is integrally attached to the rigid portion(s). In particular implementations, the relaxed, non-compressed length of the spring in a direction parallel with longest length 60 is one of: less than half, less than a third, less than a fourth, less than a fifth, less than a sixth, less than a seventh, less than an eighth, less than a ninth, less than a tenth, less than an eleventh, less than a twelfth, less than a thirteenth, less than a fourteenth, less than a fifteenth, and so forth, the length of longest length 60.

The rigid portion 50, when included, is formed of an electrically conductive metal. The metal for the rigid portions 42 and 50 may be, by non-limiting example: copper; a copper alloy; a copper-gold alloy; and the like or any of the spring material times disclosed herein.

In implementations the spring could be a type of compression spring other than a coil spring such as, by non-limiting example: a flat spring; a machined spring (which may or may not include the rigid portions of the pin); a volute spring; a Belleville spring; and the like.

The elastic coupler 36 is configured so that, when the housing 24 is lowered towards the substrate 6, the lower end 52 of the pin stops at a predetermined point 16 and travels no farther downwards. In this way, the spring of each pin is configured to prevent a contact surface of the pin from lowering beyond the predetermined point relative to the substrate when the housing is lowered towards the substrate. As described herein, the lower end 52 may be the rigid portion 42 or, in implementations in which rigid portion 42 is excluded, it may be a lower end of the spring 46. This allows electrical and/or mechanical communication to be formed between each pin and the connection traces by the act of lowering the housing onto the substrate. Accordingly, in various implementations of packages using the pins described herein, the pins may be coupled with the connection traces without the use of solder, conductive adhesive, a press-fit, and so forth. Additionally, as the coupling of the pins with the connection traces is formed by virtue of the elastic portion 44, the housing 24 could be raised and the pins would lift off the communication traces without needing to sever the pins or melt solder, or the like, for the removal.

When the spring is compressed, which occurs as the housing is lowered towards the substrate and the base 54 contacts the substrate, the pin then biases the lower end or base 54 of the pin towards the substrate and, at the same time, biases an upper portion of the pin (in other words, the portion of the pin between the spring and the top of the housing) towards the top of the housing. The spring, when compressed, also biases the two rigid portions away from one another, and it could also be said that the spring, when compressed, biases the lower rigid portion 50 downwards while biasing the upper rigid portion 42 upwards. Each pin, when compressed, is compressed along a direction that is parallel, or substantially parallel, with a longest length 60 of the pin. The act of lowering the housing electrically couples the pin with the die by contacting the lower end of the pin with a connection trace of the substrate, the connection trace of the substrate being electrically coupled with an electrical contact of the die. The housing may be secured to the substrate, or relative to the substrate, such as with a friction fit, a glue, screws, a clamping mechanism, and the like, and securing the housing to or with the substrate maintains compression of the spring. As shown in the drawings, in various implementations the two rigid portions are directly coupled together only with the spring. In implementations the pin consists of two rigid portions coupled together with a spring. Compressing the spring in various implementations includes compressing the spring between the two rigid portions of the pin.

Pins 38 may have various shapes, for instance they may have cylindrical or rounded shapes when viewed perpendicular to the longest length 60, or they may have rectangular or square shapes when viewed from that direction. In various implementations each pin 38 may have a smallest diameter, taken perpendicular to a longest length 60 of the pin, of, or of about, 0.64 mm. In implementations in which the pin 38 has a rectangular shape where it exits the top 26, the pin 38 may have a cross section taken perpendicular to the longest length 60 having a rectangular shape with a first side ranging between 1.12 mm and 1.18 mm and a second side ranging between 0.77 mm and 0.83 mm. In other implementations the rectangular shape may have a first side of 1.15 mm and a second side of 1.8 mm. In various implementations the packages shown in FIGS. 1, 2 and 9 may each have a rectangular footprint having a first side of, or of about, 66 mm and another side of, or of about, 32.5 mm. In particular implementations the packages may each have a rectangular footprint having a first side ranging between 107 mm to 108 mm and a second side ranging between 44.5 mm and 45.5 mm. In other implementations the packages may each have a rectangular footprint having a first side of 107.5 mm and a second side of 45 mm.

The packages 2 shown in the figures do not include a baseplate below the substrate 6. In other implementations a baseplate may be used, and in such implementations the baseplate may couple directly to the substrate 6 such as with an adhesive or using screws, or the like, and/or may be coupled directly to the housing 24 and pressed against substrate 6 thereby, and so forth. The baseplate may be metallic and may assist in the extraction of heat away from the die 4. Package 2 may further include one or more couplers 34 to couple the package 2 to a heat spreader, heat pipes, heat sink, and/or to an electrical ground, and the like.

Referring now to FIGS. 2, 5, 6 and 8, a semiconductor package (package) 62 includes a housing 64 having a top 66, the housing forming a cavity 68 configured to receive and/or enclose one or more die 4 therein. Package 62 includes a baseplate 78 and a plurality of substrates 6 are coupled to the baseplate. Baseplate 78 may be formed of a metallic material and may be used to extract heat or assist in extracting heat away from the die 4. The baseplate could be formed of steel, aluminum or an aluminum alloy, copper or a copper alloy, an alloy containing molybdenum and/or tungsten, and the like. The substrates 6 may be coupled to the baseplate 78 such as with a solder, an adhesive, screws, a friction fit, or the like. Housing 64 includes openings 70 and baseplate 78 includes corresponding openings 80 for a coupler 72, such as screw 74, to couple the housing 64 to the baseplate 78. Naturally this may be reversed and the two removed from one another. Other coupling mechanisms could be used such as glue, a friction fit, and so forth.

Figure 6:
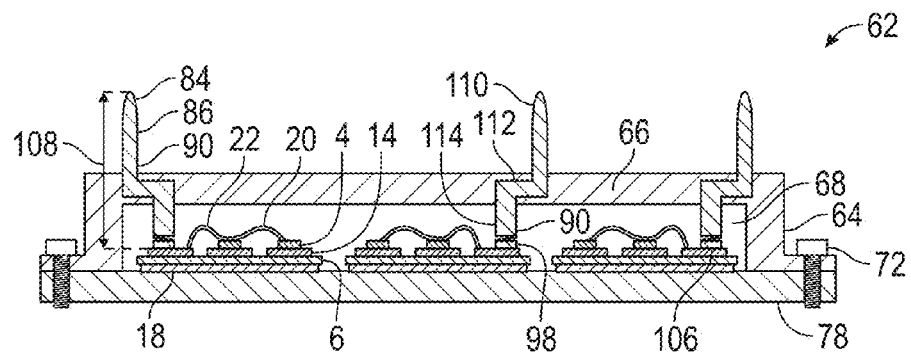
FIG. 6 is a cross-section view of the semiconductor package of FIG. 2 taken along line B-B.
Figure 7:
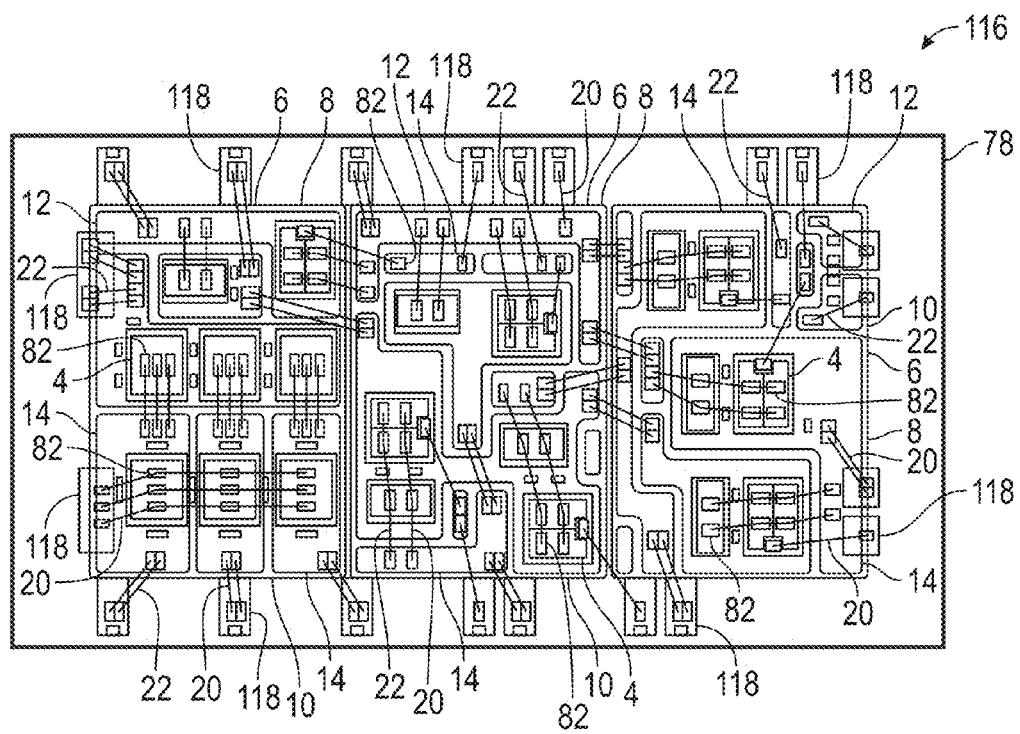
FIG. 7 is a top view of a plurality of substrates, a baseplate, and other elements of a conventional semiconductor package.
Figure 8:
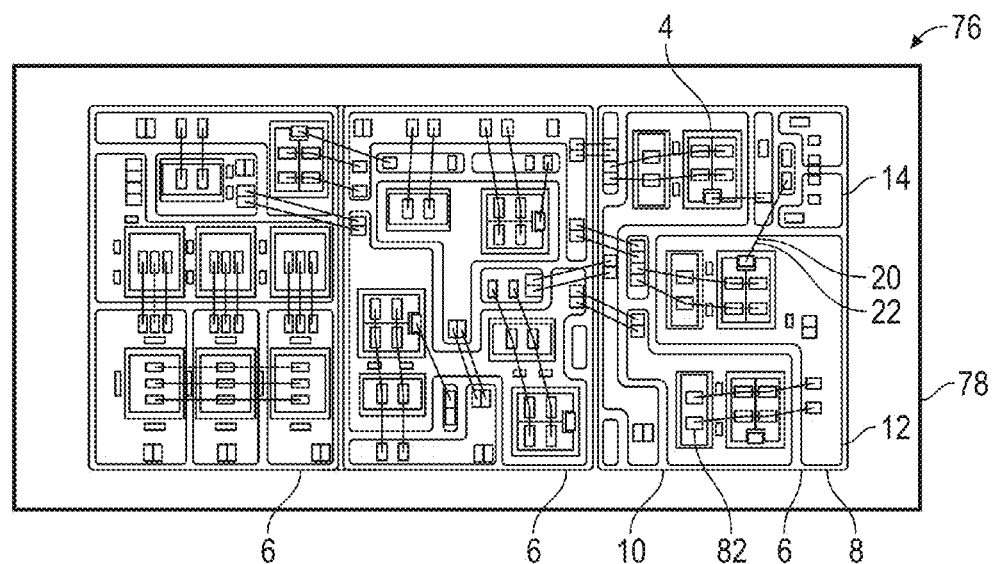
FIG. 8 is a top view of a plurality of substrates, a baseplate, and other elements of a semiconductor package.

FIGS. 7-8 show examples of assemblies 76 and 116. Assembly 76 includes the baseplate 78 and substrates 6, along with die 4 and electrical couplers 20, of FIGS. 5-6. Some of the electrical couplers 20 are coupled to pads 82 of the die 4, the pads 82 being electrical contacts on a face of the die 4. Assembly 116 differs from assembly 76 in that assembly 116 includes pin receiving members 118. Assembly 116 is a conventional assembly that is used with conventional pins. Conventional pins do not include an elastic portion and, furthermore, with packages that use a baseplate, the pins in some cases are not coupled directly to the substrate(s) atop the baseplate for a variety of reasons. By non-limiting example, when a baseplate 78 is used then, as shown in FIG. 7, pin receiving members 118 may be placed atop the baseplate and contacts of the pin receiving members may be electrically coupled to contacts of elements atop the substrate 6 using electrical couplers 20, which in implementations may be aluminum wires. Later, when the housing is placed atop the assembly 116, and when the package is installed, such as using a press-fit method with a motherboard or printed circuit board (PCB), or the like, the forces of press-fit installation will push down on the conventional pins but will not push down directly on the substrate 6 because the pins are positioned over the pin receiving members 118 instead of over the substrate. The conventional pins will thus press down instead on the baseplate 78. This may reduce the likelihood of damage to the substrate 6 during press-fit installation of the package with a motherboard, PCB or the like.

Figure 2:
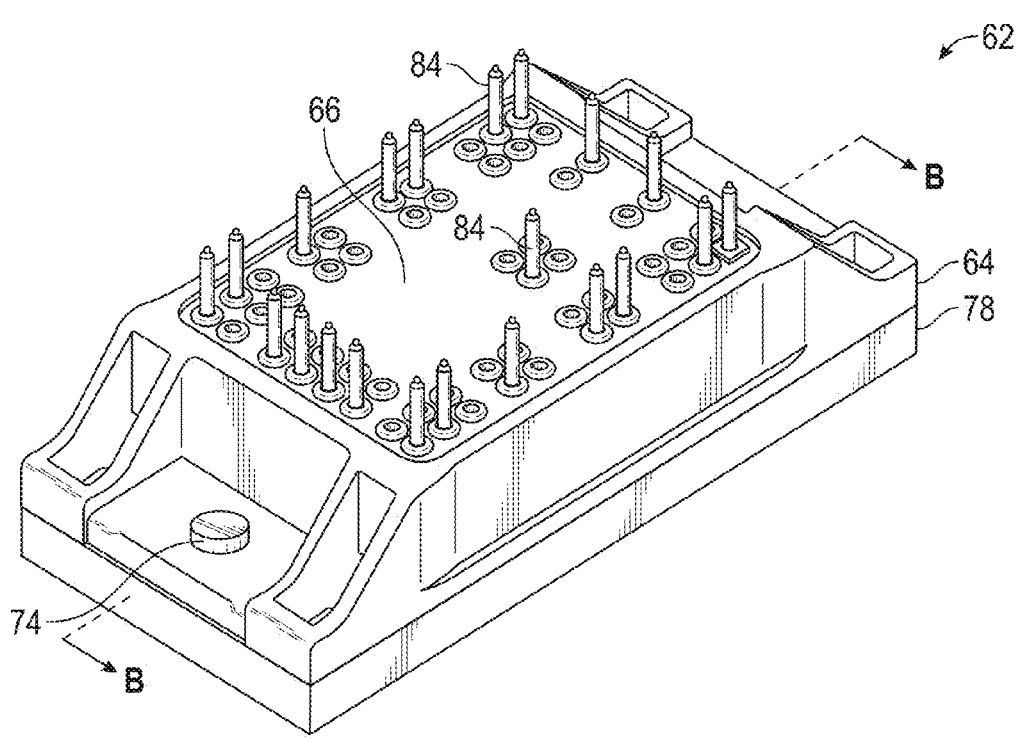
FIG. 2 is a perspective view of another implementation of a semiconductor package.
Figure 5:
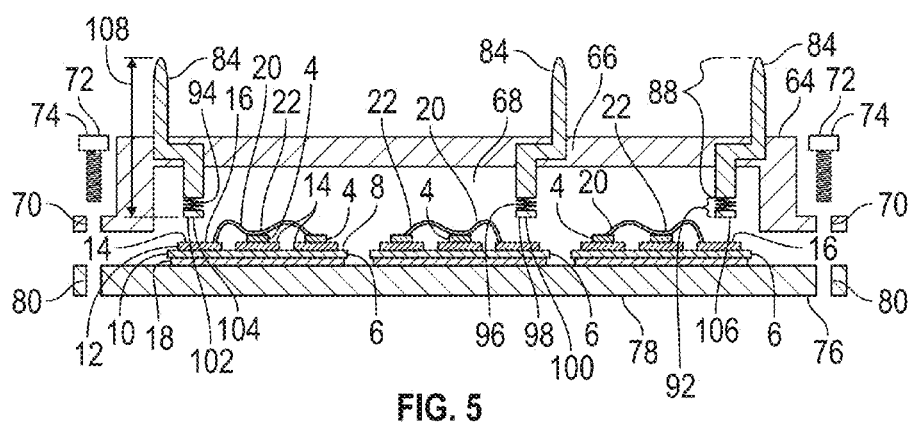
FIG. 5 is a cross-section view of the semiconductor package of FIG. 6 in an open configuration.

When the elastic couplers 84 are used, however, as shown in FIGS. 2 and 5-6, the pin receiving members 118 may not be needed since during press-fit installation of the package 62 the pins 86, if they are pressed down, the members 118 do not impart undue pressure onto the substrate 6 because of the reversibly elastically deformable lower portion (elastic portion) (lower portion) 92 which includes spring 94. Thus, package 62 may be formed with the pins 86 landing directly on the substrate 6 instead of on pin receiving members 118 of the baseplate 78. Accordingly, pin receiving members 118 may be excluded, and thus assembly 76 may be used instead of assembly 116. In implementations the package may be reduced in size because of this, with the baseplate 78 and the housing 64 having a smaller area and/or footprint, due to the lack of need to use pin receiving members 118. Package implementations in which pin receiving members 118 are excluded may also have improved operation and/or life by eliminating aluminum wirebonds.

Figure 9:
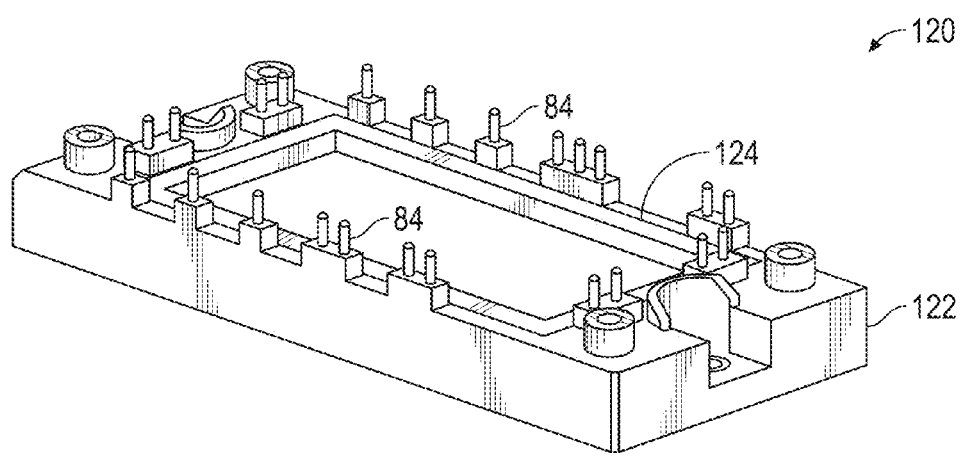
FIG. 9 is a perspective view of another implementation of a semiconductor package.

In various implementations however, the same size housing 64 and baseplate 78 could be used and one or more of the pins 86 are formed with a horizontal section 112 so that the pins 86, instead of landing on the baseplate 78, extend inwards to land on the substrate 6. Thus a perimeter defined by a plurality of elastic couplers 84 outside the package, such as shown with semiconductor package (package) 120 of FIG. 9, may be smaller than a perimeter formed by the same plurality of elastic couplers 84 within the package. Similarly, referring to FIGS. 8-9, the housing 122 may be used with assembly 76, but an outer perimeter defined by the elastic couplers 84, as seen in FIG. 9, may be larger than an outer perimeter formed by a plurality of substrates 6. Additionally some packages, such as package 120, may have pins only along a single rectangular perimeter, while others, as packages 2 and 62, may have pins not only along a rectangular perimeter but also within the rectangle defined by that perimeter. The cavity of package 120 may be partially or fully filled with an encapsulant through an opening in the housing 122 (which in FIG. 9 is rectangular) which is later covered with cover 124.

The pins 86 include, along with the horizontal section 112, a first vertical section 110 and a second vertical section 114. Furthermore, an upper portion 88 of the pin 86 includes a rigid portion 90, and the spring 94 in implementations includes a helical coil spring 96. The spring 94 couples the rigid portion 90 with rigid portion 98. A lower end 100 of the pin 86 is defined as a lower end of the rigid portion 98, if rigid portion 98 is included, or the lower end of spring 94 if rigid portion 98 is excluded, similar to pin 38. The rigid portion 98 in implementations includes a flat plate 104 having a contact surface 106 on a base 102 of the flat plate 104. The pin 86 has a longest length 108 that is substantially parallel, or parallel, with a direction of compression of spring 94.

In conventional packages wires of aluminum or another metal may be used to electrically couple one or more connection traces of the substrate with one or more pins of the package. Implementations of semiconductor packages 2, 62, 120 disclosed herein allow electrical interconnection between the die and pins of the package without the use of wirebonds or wire connections between the substrate and pins. Conventional packages use soldering to electrically and mechanically couple pins of the package with connection traces of the substrate, and thereafter a housing (such as a polymer case) is coupled to the substrate and/or a baseplate coupled to the substrate. The conventional housing has openings for the pins to pass through as the housing is being lowered towards the substrate and, therefore, the pins are not fixedly coupled to the housing. While conventional packages use an encapsulant (such as silicone potting) to encapsulate the die, any wirebonds or other electrical couplers, and a portion of each pin, the pins are nevertheless not generally fixedly coupled to the housing itself.

There exist conventional packages in which a pin is temporarily fixedly coupled to a housing. For example, U.S. Pat. App. Pub. No. 2014/0199861 to Mattiuzzo, published Jul. 17, 2014, describes a pin which may be locked in place by turning the pin after it has been soldered to a substrate and after the housing has been put in place. The pin is thus temporarily fixedly coupled to the housing in that case, but the pin could also be removed by twisting the pin in the opposite direction, and thus the pin is not permanently fixedly coupled to the housing. Additionally, the housing cannot be lifted without twisting the pin to reverse the locking procedure, and the pin is fixedly coupled to the substrate with solder, such that the housing could not be lifted relative to the substrate, without twisting the pin to the open position, without fracturing the solder connection of the pin with the substrate. Thus in that implementation the pin is only temporarily fixedly coupled to the housing.

In the implementations of packages 2, 62, 120 disclosed herein, the pins are permanently fixedly coupled to the housing by being at least partially encapsulated within the housing during formation of the housing. Thus, in these implementations the housing, after the pins have been at least partially encapsulated therein, is not free to move without moving the pins as well. As described herein, however, in implementations of packages 2, 62, 120, the pins could be only temporarily fixedly coupled to the housing, such as with threads, a friction fit, or the like. In implementations in which pins are partially encased within the housing they are molded so that they are appropriately aligned with connection traces of the substrate in a way to ensure proper operation of the package 2, 62, 120. In implementations in which the housing is formed with injection molding, the plastic injection mold chase may be designed to arrange the pins before plastic injection.

Each spring as disclosed herein is integrated with one of the pins in the longitudinal direction. In implementations of packages 2, 62, 120 disclosed herein, pressure between the individual pins and the substrate is maintained by virtue of the plastic case being coupled with the substrate. The pins as described herein may be configured to be press-fit pins, such as to be press fit into hollow pin receivers of a motherboard or PCB, or they may be solder pins, configured to be soldered to connection traces or other elements of a motherboard, PCB or the like. In implementations in which the pins are press fit pins they may have a press fit portion proximate a distal end (opposite the end closest to the elastic portion or spring). The press fit portion may include elements such as, by non-limiting example, a compressible section that is configured to compress along a direction perpendicular with the direction of insertion of the pin into a pin receiver, which compression may comprise only elastic or may comprise elastic and plastic deformation. The compressible section may include an opening passing through the pin along a direction perpendicular with a longest length of the pin, though in implementations the compressible section may include other elements and/or the press fit portion may exclude an opening. A wide variety of other type of press-fit sections and designs may be utilized and selected by those of ordinary skill in the art using the principles disclosed herein.

Although the flat plate 56, 104 shown in the drawings has a width, substantially parallel with a longest length 60, 108 of the pin 38, 86, that is greater than a height of the flat plate 56, 104—the height being substantially parallel with a longest length 60, 108 of the pin 38, 86—in other implementations the flat plate 56, 104 could have a height greater than its width.

In implementations of conventional packages in which pins are soldered to connection traces of the substrate, there can be damage to the substrate, the solder joint, and/or other elements of the package when the housing is lowered towards the substrate and/or when the pins are press-fit into pin receivers of a motherboard or PCB. Pins 38, 86 remove the potential for such damage due to the lack of a solder connection between the pin and substrate and due to the elastic portions 44, 92.

In implementations of packages disclosed herein there is no soldering process to couple the pins to the substrate, and there is no wirebond connection between the substrate and the pins. The lack of a solder connection between the pins and the substrate may eliminate a second solder reflow process for the assembly of the package, as a first solder reflow may have occurred when coupling the die to the substrate. This can reduce other problems, such as movement or float of the die during the second solder reflow. In implementations the pins 38, 86 may increase a contact area, and otherwise improve electrical contact, between the pin and the substrate as compared with conventional pins. The housings disclosed herein may be laser marked, or the like, at any point in the assembly process.

In places where the description above refers to particular implementations of semiconductor packages with elastic couplers and related methods and implementing components, sub-components, methods and sub-methods, it should be readily apparent that a number of modifications may be made without departing from the spirit thereof and that these implementations, implementing components, sub-components, methods and sub-methods may be applied to other semiconductor packages with elastic couplers and related methods. For example, characteristics, sizes, and the like of elements and sub-elements of one package, such as a package 2, may be used with a package 62 or 120, and so forth.

What is claimed is:

1. A method of forming a semiconductor package, comprising:
    securing a pin to a housing, the pin comprising a spring located in the pin between the housing and a substrate;
    lowering the housing relative to the substrate having a semiconductor die (die) coupled thereon to at least partially enclose the die within a cavity of the housing, wherein the lower end of the pin comprises a flat plate and wherein, prior to lowering the housing, the flat plate is coupled to the upper portion of the pin through only the spring; and
    while lowering the housing, compressing the spring so that a lower end of the pin does not lower beyond a predetermined point relative to the flat plate and the lower end of the pin so that an upper portion of the pin is biased towards the housing,
    wherein lowering the housing comprises electrically coupling the pin with the die.

2. The method of claim 1, further comprising securing the housing to the substrate.

3. The method of claim 2, wherein securing the housing to the substrate comprises maintaining compression of the spring.

4. The method of claim 1, wherein compressing the spring comprises compressing the spring between two rigid portions of the pin.

5. The method of claim 4, wherein compressing the spring comprises biasing the two rigid portions of the pin away from one another.

6. The method of claim 1, wherein compressing the spring comprises compressing the spring along a direction substantially parallel with a longest length of the pin.

* * * * *